United States Patent [19]

Muragishi

[11] Patent Number: 5,326,989
[45] Date of Patent: Jul. 5, 1994

[54] SEMICONDUCTOR DEVICE HAVING THIN FILM TRANSISTOR AND METHOD OF MANUFACTURING THE SAME

[75] Inventor: Takeo Muragishi, Hyogo, Japan

[73] Assignee: Mistubishi Denki Kabushiki Kaisha, Tokyo, Japan

[21] Appl. No.: 845,979

[22] Filed: Mar. 4, 1992

[30] Foreign Application Priority Data

Dec. 4, 1991 [JP] Japan .................. 3-319471

[51] Int. Cl.$^5$ ............................................. H01L 29/78
[52] U.S. Cl. ..................... 257/67; 257/347; 257/635; 257/640; 257/646; 257/649
[58] Field of Search ............... 257/67, 640, 646, 347, 257/635, 649

[56] References Cited

U.S. PATENT DOCUMENTS

| 5,041,888 | 8/1991 | Possin et al. ......................... 257/640 |
| 5,130,772 | 7/1992 | Choi .................................... 257/640 |

FOREIGN PATENT DOCUMENTS

| 0465170 | 6/1991 | European Pat. Off. . |
| 0465170A2 | 6/1991 | European Pat. Off. . |
| 1-125978 | 5/1989 | Japan . |
| 1-181569 | 7/1989 | Japan . |
| 2-260462 | 10/1990 | Japan . |

OTHER PUBLICATIONS

"Stacked CMOS SRAM Cell", C. E. Chen et al., IEEE Electron Device Letter, vol. EDL-4, No. 8, Aug. 1983 pp. 272-274.

"A high density SRAM cell using poly-Si pMOS FET", T. Yamanaka et al., SDM89-19, pp. 1-6.

"A 4-Mb CMOS SRAM with a PMOS Thin-Film-Transistor Load Cell", T. Ootani et al., IEEE Journal of Solid-State Circuits, vol. 25, No. 5, Oct. 1990, pp. 1082-1091.

Primary Examiner—Edward Wojciechowicz
Attorney, Agent, or Firm—Lowe, Price, LeBlanc & Becker

[57] ABSTRACT

A thin film transistor is used as a load transistor in a memory cell in a SRAM. A load thin film transistor is arranged on an interlayer insulating layer on the surface of a silicon substrate. A silicon layer in which source-/drain regions of the thin film transistor are formed is covered with an oxidation preventing film. An interlayer insulating layer which is to be subject to high temperature reflow processing is formed on the surface of the oxidation preventing film. The oxidation preventing film is formed of polycrystalline silicon, amorphous silicon, silicon nitride, or the like and formed on the silicon layer in the thin film transistor directly or through an insulating layer to cover the surface of the silicon layer.

9 Claims, 17 Drawing Sheets

SEMICONDUCTOR DEVICE HAVING THIN FILM TRANSISTOR AND METHOD OF MANUFACTURING THE SAME

BACKGROUND OF THE INVENTION

Field of the Invention

The present invention relates to semiconductor devices, and, more particularly, to a structure of a semiconductor device provided with a thin film transistor (hereinafter referred to as TFT) and a method of manufacturing the same.

Description of the Background Art

A memory cell in a SRAM (Static Random Access Memory) will be described in the following as an example of a semiconductor device provided with a thin film transistor. FIG. 32 is an equivalent circuit diagram of a general memory cell in a SRAM. Referring to FIG. 32, a memory cell in a SRAM has a pair of CMOS inverters. One of the CMOS inverters has a driver MOS transistor $Q_2$ and a load thin film transistor $Q_1$. The other CMOS inverter has a driver MOS transistor $Q_4$ and a load thin film transistor $Q_3$. The gates of transistors $Q_2$, $Q_1$ in one CMOS inverter are cross-connected to a common storage node $N_2$ of transistors $Q_4$, $Q_3$ in the other CMOS inverter, and the gates of transistors $Q_4$, $Q_3$ in the other CMOS inverter are cross-connected to a common storage node $N_1$ of transistors $Q_2$, $Q_1$ in the one CMOS inverter to implement a flip-flop circuit. The sources of load thin film transistors $Q_1$, $Q_3$ are connected to a power supply Vcc. Sources of driver MOS transistors are connected to a ground potential Vss. Transfer MOS transistors $Q_5$, $Q_6$ are connected, respectively, to storage nodes $N_1$, $N_2$ in the flip-flop circuit. The gates of transfer MOS transistors $Q_5$, $Q_6$ are connected to a word line 30. The drain regions of transfer MOS transistors $Q_5$, $Q_6$ are connected, respectively, to bit lines 31, 32.

FIG. 31 is a cross sectional view illustrating a specific structure of the memory cell illustrated in FIG. 32. The illustrated structure of the memory cell is similar to a structure of a memory cell disclosed in A Cell with Polysilicon Thin Film Transistor (TFT) for a 4M bit SRAM and so on, Denshi Joho Tsushin Gakkai Gijyutsu Kenkyu Hokoku, Shingaku Giho Vol. 90, No. 48, 1990, for example, and it is a typical cross section illustrated schematically. Referring to FIG. 31, a driver MOS transistor $Q_2$ and a transfer MOS transistor $Q_6$ formed on a main surface of a semiconductor substrate 1 and a load thin film transistor $Q_3$ arranged in an upper layer with a first interlayer insulating layer 12 interposed therebetween are illustrated in the drawing. Driver MOS transistor $Q_2$ formed on the main surface of silicon substrate 1 includes a gate electrode 6a, a pair of source/drain regions 9a, 9a, and a gate insulating layer 5a. Transfer MOS transistor $Q_6$ formed on the main surface of silicon substrate 1 includes a gate electrode 6b, a pair of source/drain regions 9b, 9b, and a gate insulating layer 5b. The memory cell is characterized by the structure in which the load thin film transistor is formed above the substrate with first interlayer insulating layer 12 interposed therebetween. Thin film transistor $Q_3$ includes a gate electrode 13 formed on the surface of first interlayer insulating layer 12, a gate insulating layer 14 formed on the surface of gate electrode 13, and a polycrystalline silicon layer 15 formed on the surface of gate insulating layer 14. In polycrystalline silicon layer 15, a channel region 15a is formed in a position opposite gate electrode 13, and a pair of source/drain regions 15b, 15b is formed on both sides of channel region 15a. Each of source/drain regions 15b, 15b in polycrystalline silicon layer 15 extends to a predetermined position to serve as an interconnection layer. Specifically, as illustrated, one impurity region 15b is connected through a contact electrode 11 to source/drain region 9b of transfer MOS transistor $Q_6$.

A thick second interlayer insulating layer 16 is formed on the surface of thin film transistor $Q_3$. An aluminum interconnection layer 20 is connected, through a contact hole formed in second interlayer insulating layer 16 and through a barrier metal layer 19, to source/drain region 9b of transfer MOS transistor $Q_6$. The surface of aluminum interconnection layer 20 is covered with a passivation film 21.

However, in the memory cell as illustrated in FIG. 31, the surface of polycrystalline silicon layer 15 in thin film transistor $Q_3$ is oxidized to form a silicon oxide film 22, and, as a result, there is a problem of a reduced thickness of polycrystalline silicon layer 15. A state of formation of silicon oxide film 22 will be described in the following.

FIGS. 33 and 34 are cross sectional views illustrating a main manufacturing process of the memory cell in a SRAM illustrated in FIG. 31. First, referring to FIG. 33, a polycrystalline silicon layer is formed on the surface of first interlayer insulating layer 12 by a CVD (Chemical Vapor Deposition) process. Then, the polycrystalline silicon layer is patterned to form a gate electrode 13. A gate insulating layer 14 is formed on the surface of gate electrode 13 by a CVD process. A polycrystalline silicon layer 15 is formed by a CVD process. Then, polycrystalline silicon layer 15 is patterned using a photolithography process and an etching process. Then, a predetermined region is covered with a resist mask 24, and then, p-type impurity ions 25 are introduced into polycrystalline silicon layer 15. Source/drain regions 15b, 15b of thin film transistor $Q_3$ are formed by doing this.

Then, as illustrated in FIG. 34, the resist mask is removed, and then, a BPSG (Boro-Phospho Silicate Glass) layer 16 is formed on the whole surface by a CVD process. Large steps are formed on the surface of BPSG layer 16 in accordance with the stepped shape of the surface of the lower layer. Accordingly, heat treatment is carried out for flattening the surface of BPSG layer 16. The heat treatment for flattening is carried out in an atmosphere of water vapor at a temperature in the range of 850° C. to 900° C. for about 20 to 30 minutes, for example. The heat treatment causes the surface of softened BPSG to reflow to be flattened.

However, in such a flattening process, oxygen in the atmosphere is diffused into the BPSG layer and reaches the surface of polycrystalline silicon layer 15 in the thin film transistor to cause an oxidation reaction with the silicon constituent of the polycrystalline silicon layer. This causes a silicon oxide film 22 to be formed on the surface of polycrystalline silicon layer 15. If silicon oxide film 22 is formed, the thickness of polycrystalline silicon layer 15 is reduced, and, in the worst case, the polycrystalline silicon is partially lost. In addition, such oxidation of polycrystalline silicon layer 15 is not generated uniformly in the surface of a wafer, so that it causes the polycrystalline silicon layer to have different thicknesses for respective thin film transistors. If the thickness of polycrystalline silicon layer 15 is reduced, the resistance is increased particularly in source/drain regions 15b, 15b and the interconnection part continuous with them. Furthermore, the uneven thickness of polycrystalline silicon layer 15 in the surface of the wafer causes a problem of diversification in characteristics of respective transistors. On the other hand, if the conditions of the heat treatment for flattening are mitigated in order to solve the problem as described above which is caused by the heat treatment for flattening second interlayer insulating layer 16, the flatness of the surface of second interlayer insulating layer 16 is impaired. This causes large steps to be formed on the surface of the interconnection layer formed on second interlayer insulating layer 16. As a result, patterning of the interconnecting layer becomes difficult, accuracy of the interconnection pattern declines, and, in an extreme case, a problem of disconnection arises.

SUMMARY OF THE INVENTION

An object of the present invention is to provide a semiconductor device having a structure capable of preventing the thickness of a silicon layer in a thin film transistor from becoming smaller in a manufacturing process.

Another object of the present invention is to provide a method of manufacturing a semiconductor device capable of preventing the thickness of a silicon layer in a thin film transistor from becoming smaller in a manufacturing process.

Still another object of the present invention is to improve flatness of an interlayer insulating layer covering the surface of a thin film transistor formed in a largely stepped region.

A semiconductor device according to an aspect of the present invention includes a first insulating layer formed on a semiconductor substrate and a thin film transistor formed on the surface of the first insulating layer. The thin film transistor includes a gate electrode layer and a silicon layer formed thereon through a second insulating layer, a channel region formed in the silicon layer in a position opposite the gate electrode layer, and a pair of impurity regions formed on the both sides of the channel region. An oxidation preventing film is formed on the thin film transistor to cover at least the upper part of the thin film transistor for preventing the silicon layer in the thin film transistor from being oxidized by preventing oxygen from passing inside the thin film transistor.

A method of manufacturing a semiconductor device according to another aspect of the present invention includes the following steps. First, a first insulating layer is formed on the surface of a semiconductor substrate. Then, a conductive layer is formed on the surface of the first insulating layer and patterned to form a gate electrode. Then, a second insulating layer is formed on the surface of the gate electrode. A silicon layer is formed on the surface of the second insulating layer. Then, a pair of impurity regions is formed in the silicon layer, and an oxidation preventing film is formed on the surface of the silicon layer.

A method of manufacturing a semiconductor device according to still another aspect of the present invention includes the following steps. First, a first insulating layer is formed on the surface of a semiconductor substrate. Then, a silicon layer is formed on the surface of the first insulating layer. A second insulating layer is formed on the surface of the silicon layer. Then, a conductive layer is formed on the surface of the second insulating layer and patterned to form a gate electrode. Then, a pair of impurity regions spaced apart from each other is formed in the silicon layer. Then, an oxidation preventing film is formed on the surfaces of the silicon layer and the gate electrode.

According to the present invention, an oxidation preventing film is formed on the thin film transistor. In a case where the thin film transistor formed beneath the oxidation preventing film is exposed in an atmosphere of oxidation during a manufacturing process of a semiconductor device, the oxidation preventing film serves for preventing oxygen in the atmosphere from passing through the oxidation preventing film to reach the thin film transistor, particularly to reach the silicon layer. Polycrystalline silicon, amorphous silicon, refractory metal silicide, silicon nitride, or the like is used as a material for the oxidation preventing film. If polycrystalline silicon, amorphous silicon, or the like is used, oxygen in the atmosphere reacts with silicon in the film to produce an oxide film to prevent oxygen from being supplied to the silicon layer in the thin film transistor in the lower layer. Refractory metal silicide, silicon nitride, or the like has characteristics for preventing oxygen from passing through the layer. Formation of an oxidation preventing film using these materials prevent the thickness of the silicon layer in the thin film transistor from being reduced. In addition, it is possible to carry out the heat treatment for flattening of the interlayer insulating layer without considering reduction in the thickness of the silicon layer in the thin film transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
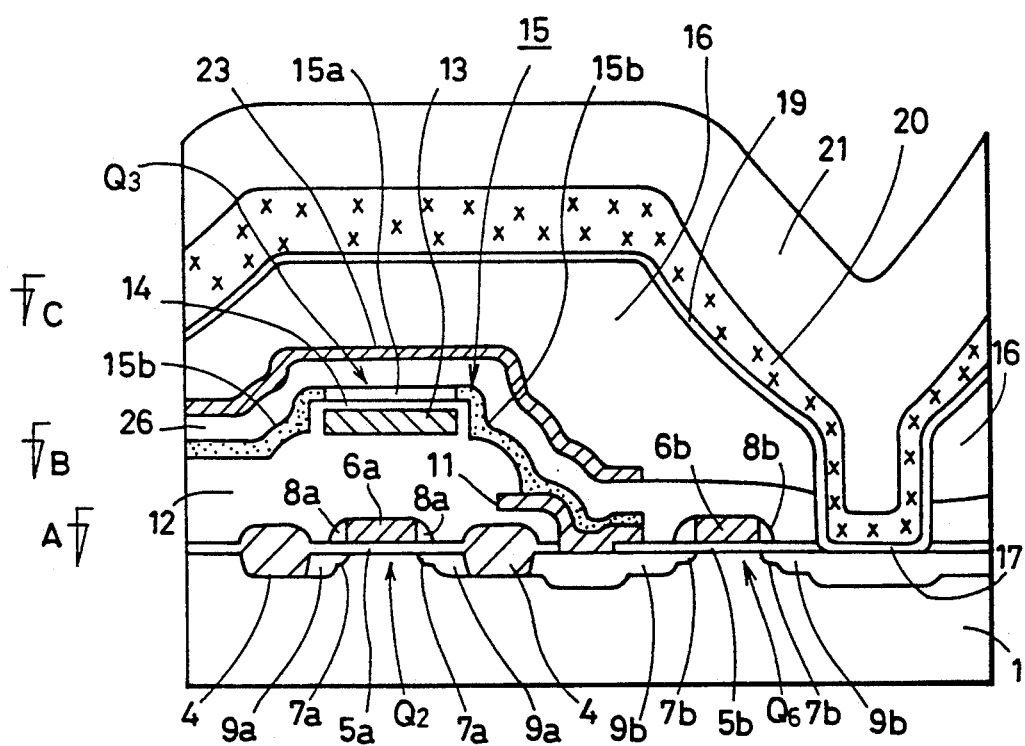
FIG. 1 is a cross sectional view illustrating a structure of a memory cell in a SRAM according to a first embodiment of the present invention.
Figure 2:
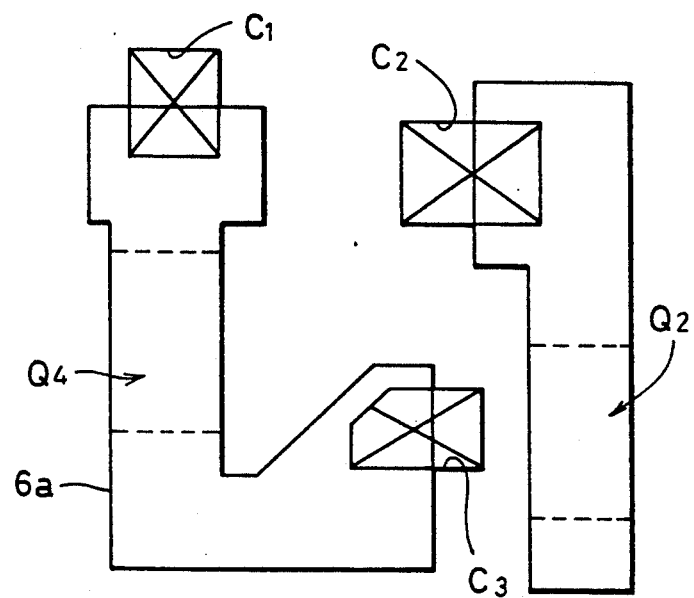
FIG. 2 is a plan view taken along line A— in FIG. 1.
Figure 3:
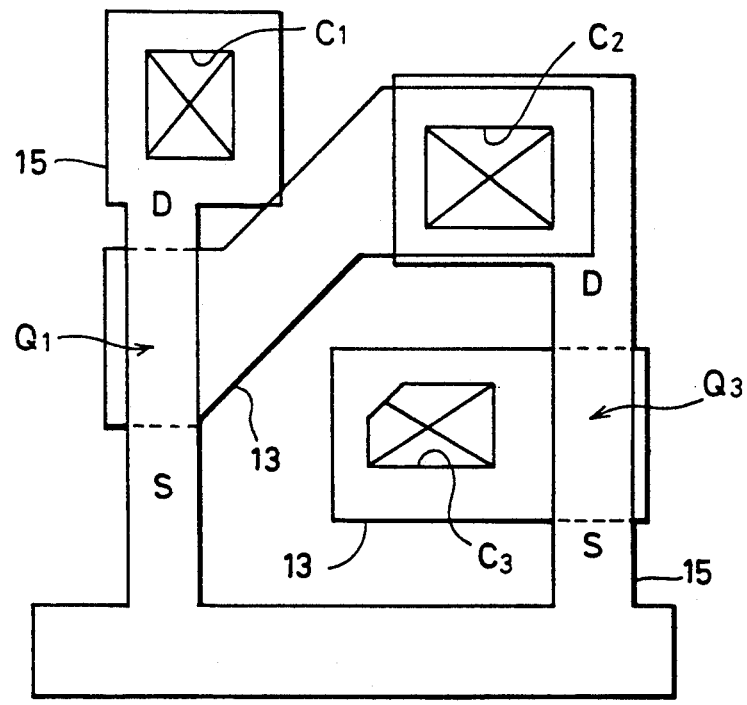
FIG. 3 is a plan view taken along line B— in FIG. 1.
Figure 32:
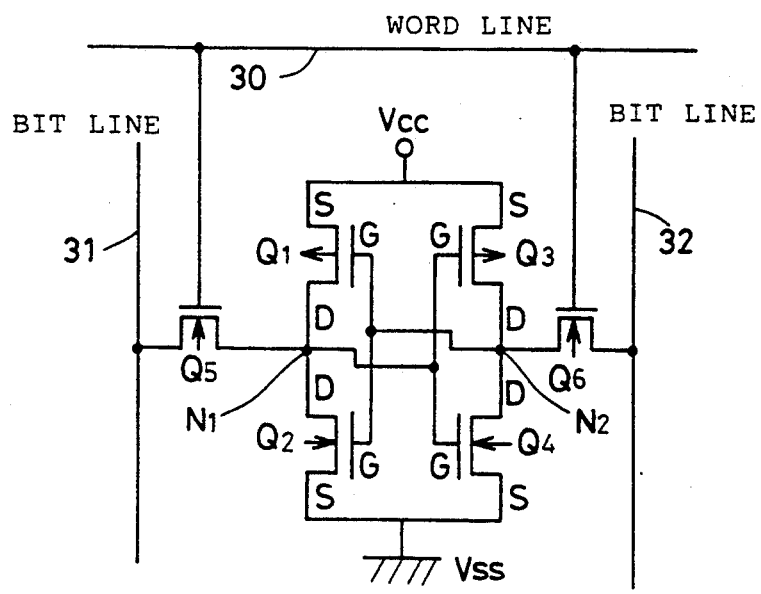
FIG. 32 is an equivalent circuit diagram of the memory cell in a SRAM illustrated in FIG. 31.
Figure 33:
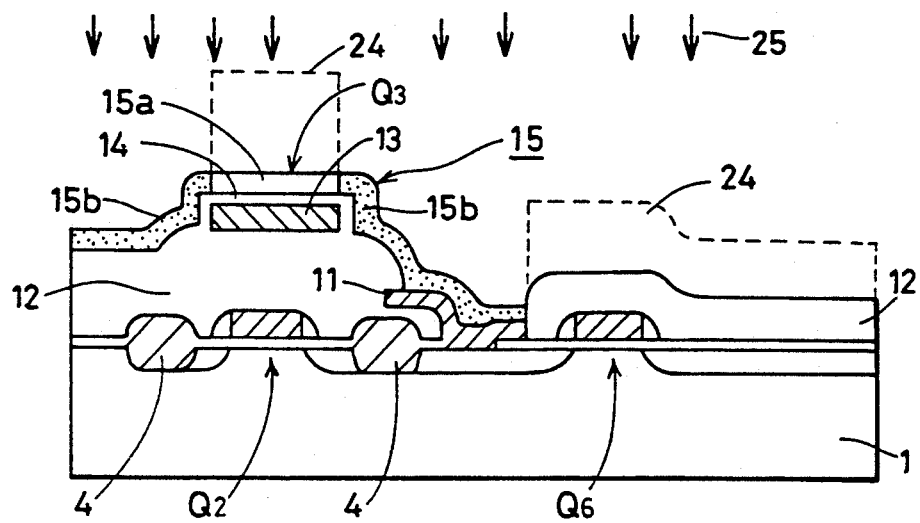
FIGS. 33 and 34 are cross sectional views of the memory cell illustrated in FIG. 31 in first and second steps of a main manufacturing process.
Figure 34:
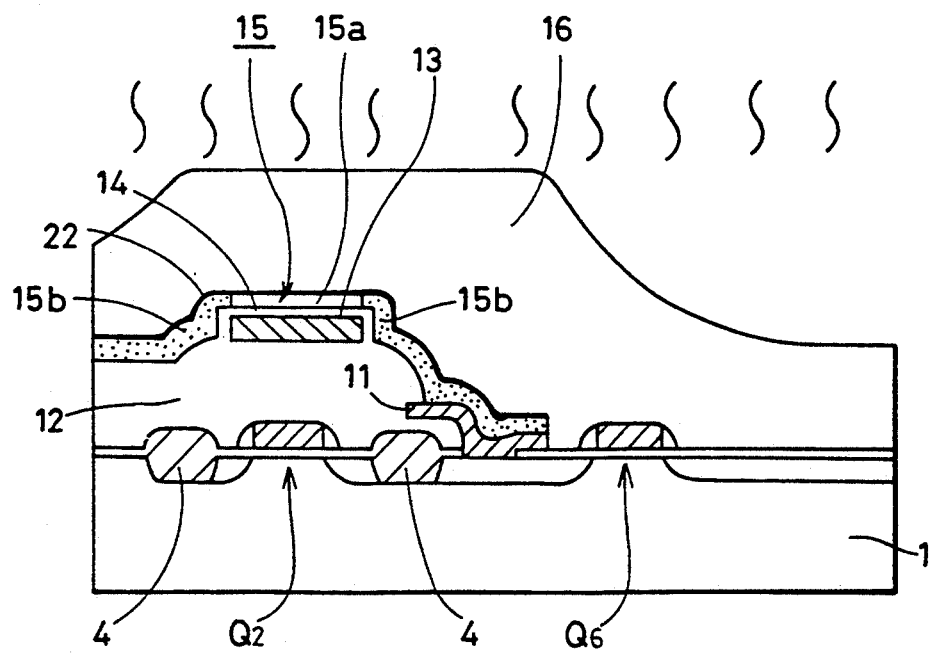

A memory cell in a SRAM illustrated in FIGS. 1–4 has the same structure as that of the equivalent circuit illustrated in FIG. 32, and the cross section illustrated in FIG. 1 typically shows a driver MOS transistor $Q_2$, a transfer MOS transistor $Q_6$, and a load thin film transistor $Q_3$. The structures in plans in FIGS. 2 and 4 typically show two driver MOS transistors $Q_2$, $Q_4$ and two load thin film transistors $Q_1$, $Q_3$, and two MOS transistors $Q_5$, $Q_6$ are not illustrated. The structure of driver MOS transistor $Q_2$ and transfer MOS transistor $Q_6$ in FIG. 1 do not completely correspond to the structures illustrated in FIGS. 2–4, and the structure of the MOS transistors is schematically illustrated in FIG. 1 to represent their characteristics.

Referring to FIGS. 1–4, two driver MOS transistors $Q_2$, $Q_4$ and two transfer MOS transistors $Q_5$, $Q_6$ are formed on a main surface of a silicon substrate 1. Each of MOS transistors $Q_2$, $Q_4$, $Q_5$, $Q_6$ includes a gate electrode (6a, 6b . . .) formed on the surface of a gate insulating layer (5a, 5b . . .) and a pair of source/drain regions (7a, 9a, 7b, 9b . . .). The source/drain region has a so-called LDD (Lightly Doped Drain) structure including low concentration impurity regions 7a, 7b and high concentration impurity regions 9a, 9b. The surfaces of MOS transistors $Q_2$, $Q_4$, . . . , $Q_6$ are covered with a first interlayer insulating layer 12. Two load thin film transistors $Q_1$, $Q_3$ are formed on the surface of first interlayer insulating layer 12. Each of load thin film transistors $Q_1$, $Q_3$ includes a gate electrode 13 formed of polycrystalline silicon, a gate insulating layer 14 covering the surface of gate electrode 13, and a silicon layer 15 extending on the surfaces of gate insulating layer 14 and first interlayer insulating layer 12. Silicon layer 15 is formed of polycrystalline silicon, monocrystalline silicon, or the like. A channel region 15a of the thin film transistor is formed in silicon layer 15 in a position opposite gate electrode 13. Source/drain regions 15b, 15b implemented with a pair of p-type impurity regions are formed on the both sides of channel region 15a. The pair of impurity regions 15b, 15b also serves as an interconnection layer region. Normally, silicon layer 15 is formed with a thickness in the range of about 200 Å to about 500 Å.

Now, connection of each of transistors included in the memory cell will be described with reference to FIGS. 2–4 and FIG. 32. Gate electrode 6a of driver MOS transistor $Q_4$ is connected through a contact part $C_1$ to the source/drain region of load thin film transistor $Q_1$ and is also connected through a contact part $C_3$ to gate electrode 13 of load thin film transistor $Q_3$. Gate electrode 13 of load thin film transistor $Q_1$ is connected through contact $C_2$ to the source/drain region of load thin film transistor $Q_3$. Silicon layers 15 in load thin film transistors $Q_1$, $Q_3$ are formed continuously as the same layer.

Figure 4:
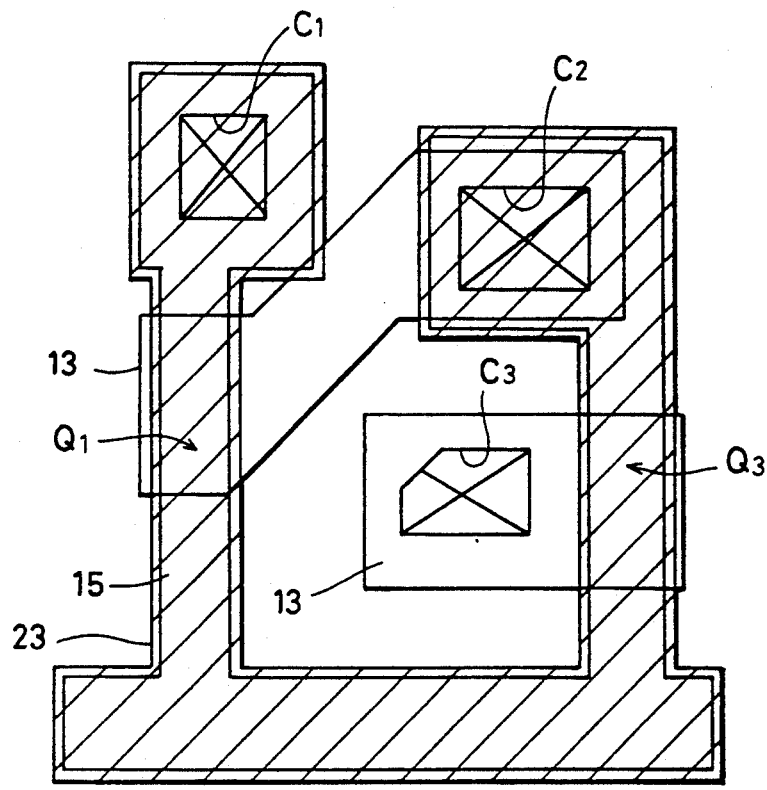
FIG. 4 is a plan view taken along line C— in FIG. 1.

Referring mainly to FIG. 1 again, the surfaces of load thin film transistors $Q_1$, $Q_3$ are covered with a third interlayer insulating layer 26. An oxidation preventing film 23 is formed on the surface of third interlayer insulating layer 26. As illustrated in FIG. 4, oxidation preventing film 23 is patterned to have approximately the same shape in a plan as silicon layer 15 in load thin film transistors $Q_1$, $Q_3$ and formed to cover the surface of silicon layer 15 completely. A conductive film of polycrystalline silicon, amorphous silicon, refractory metal silicide, or the like or an insulating film such as a silicon nitride film, for example, is used as oxidation preventing film 23. If polycrystalline silicon, amorphous silicon, or the like is used, the layer supplies silicon to oxygen supplied from the atmosphere to produce an oxide to prevent the oxygen from being transmitted to the lower layer. If a silicon nitride film is used, the film has an oxidation resistant property and functions to prevent the oxygen from passing through. The relation between the shape of oxidation preventing film 23 and the shape of silicon layer 15 to be protected by the oxidation preventing film is as follows: If oxidation preventing film 23 is formed so that silicon layer 15 is included in a region which oxidation preventing film 23 covers, it is possible to prevent the surface of silicon layer 15 from reacting with oxygen supplied from the atmosphere and causing an oxidation reaction. Therefore, oxidation preventing film 23 may be formed to have any shape in accordance with a region to be protected. For example, if only channel region 15a and source/drain regions 15b, 15b are to be protected, it is unnecessary to cover the interconnection region continuous with source/drain regions 15b, 15b, and if only the interconnection region of silicon layer 15 is to be protected, it is unnecessary to cover the upper part of the thin film transistor. In addition, if necessary, oxidation preventing film 23 may be formed on the whole surface of the substrate except contact portions.

A thick second interlayer insulating layer 16 is formed on the surface of oxidation preventing film 23. Second interlayer insulating layer is formed of BPSG or the like. An aluminum interconnection layer 20 is formed on the surface of second interlayer insulating layer 16 through a barrier metal layer 19. A passivation film 21 is formed on the surface of aluminum interconnection layer 20.

Now, a manufacturing process of the memory cell in a SRAM illustrated in FIG. 1 will be described.

Figure 5:
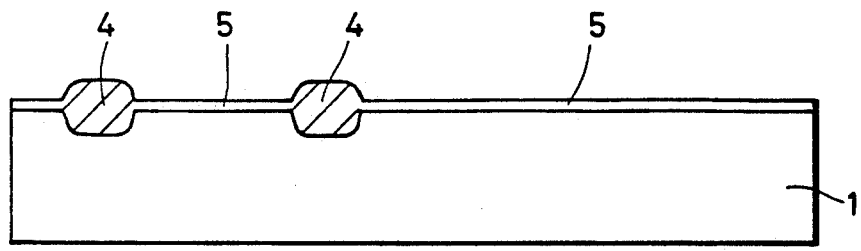
FIGS. 5-15 are cross sectional views sequentially illustrating the memory cell in a SRAM illustrated in FIG. 1 in respective steps of a manufacturing process.

First, referring to FIG. 5, element isolating oxide films 4 are formed in predetermined positions on a main surface of a silicon substrate 1 using a LOCOS (Local Oxidation of Silicon) process. Then, a gate insulating layer 5 is formed on the main surface of silicon substrate 1 using a thermal oxidation process or the like.

Figure 6:
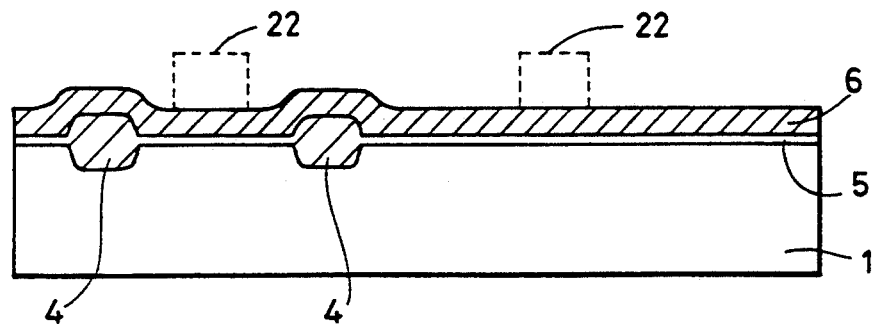

Then, referring to FIG. 6, a polycrystalline silicon layer 6 is formed on the whole surface. Then, a resist pattern 22 having a predetermined shape is formed on the surface of polycrystalline silicon layer 6.

Figure 7:
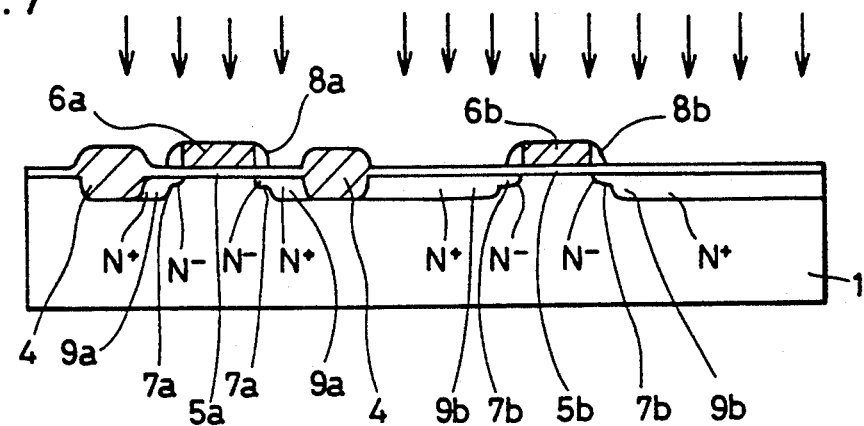

Then, referring to FIG. 7, polycrystalline silicon layer 6 is patterned using resist pattern 22 as a mask to form gate electrodes 6a, 6b. Then, n-type impurities of a low concentration are ion-implanted into silicon substrate 1 using gate electrodes 6a, 6b as a mask to form low concentration impurity regions 7a, 7b. Then, an insulating layer is formed on the whole surface, and anisotropic etching is carried out to form sidewall insulating layers 8a, 8b on the sidewalls of gate electrodes 6a, 6b. Impurities of a high concentration are ion-implanted into the surface of silicon substrate 1 using gate electrodes 6a, 6b and sidewall insulating 1 layers 8a, 8b as a mask to form high concentration impurity regions 9a, 9b. This step completes a so-called LDD structure.

Figure 8:
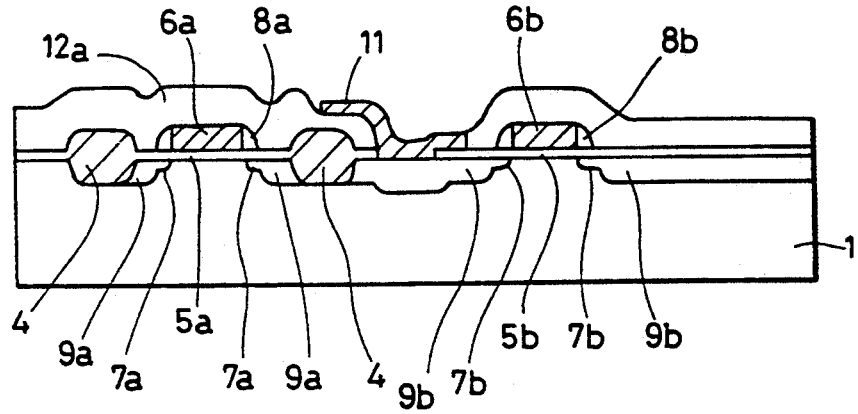

Then, referring to FIG. 8, a first interlayer insulating layer 12a is formed on the whole surface using a CVD process or the like. Then, an opening is formed on the surface of impurity region 9a. Then, a contact electrode 11 is formed to be connected through the opening to high concentration impurity region 9b.

Figure 9:
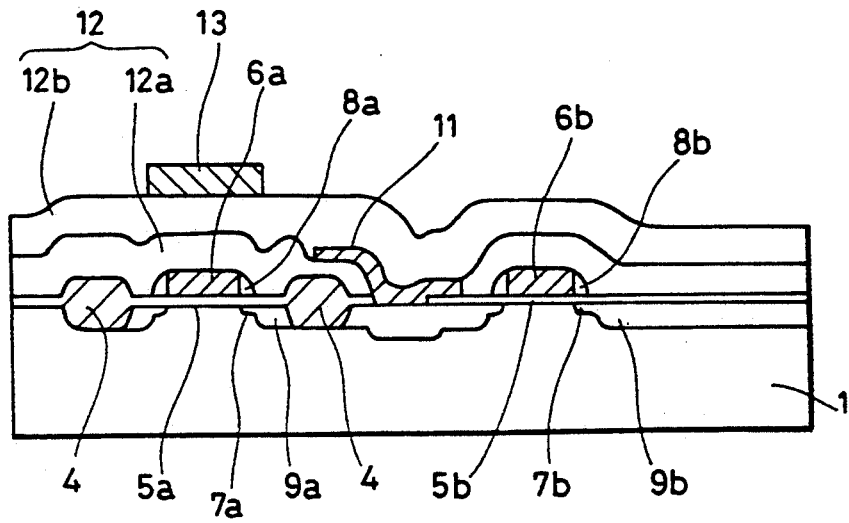
Figure 10:
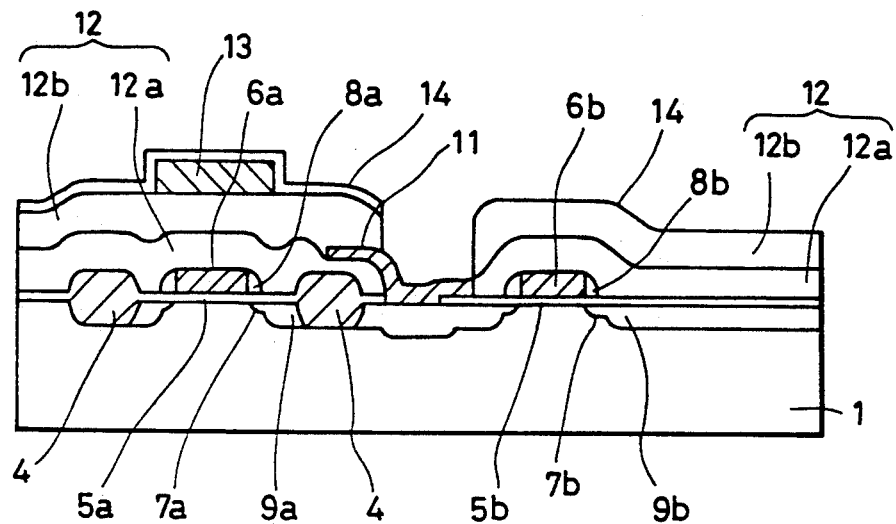

Then, referring to FIG. 9, an interlayer insulating layer 12b is formed on the surface of interlayer insulating layer 12a. A polycrystalline silicon layer is formed on the surface of interlayer insulating layer 12b by using a CVD process, for example, and patterned into a predetermined shape to form a gate electrode 13 of a thin film transistor. Then, referring to FIG. 10, a gate insulating layer 14 is formed on the whole surface by using a CVD process, for example. Then, an opening is formed by a photolithography process and an etching process to reach the surface of contact electrode 11.

Figure 11:
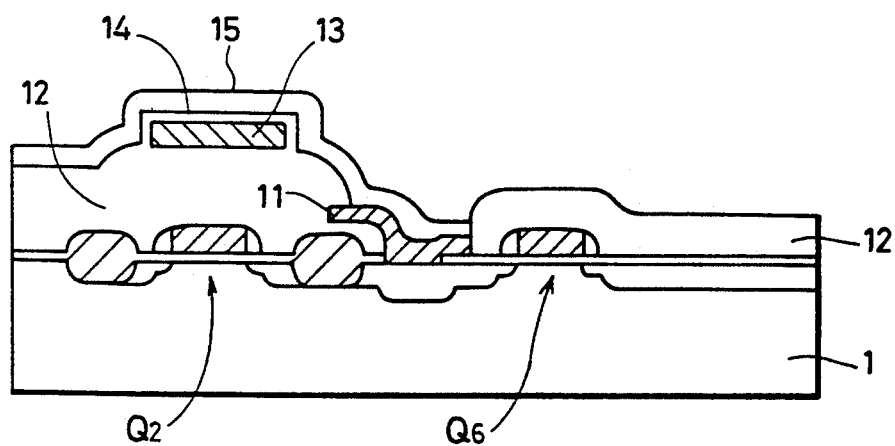

Then, referring to FIG. 11, a silicon layer 15 of polycrystalline silicon or amorphous silicon is formed on the whole surface by a CVD process to have a thickness in the range of 200 Å to about 500 Å.

Figure 12:
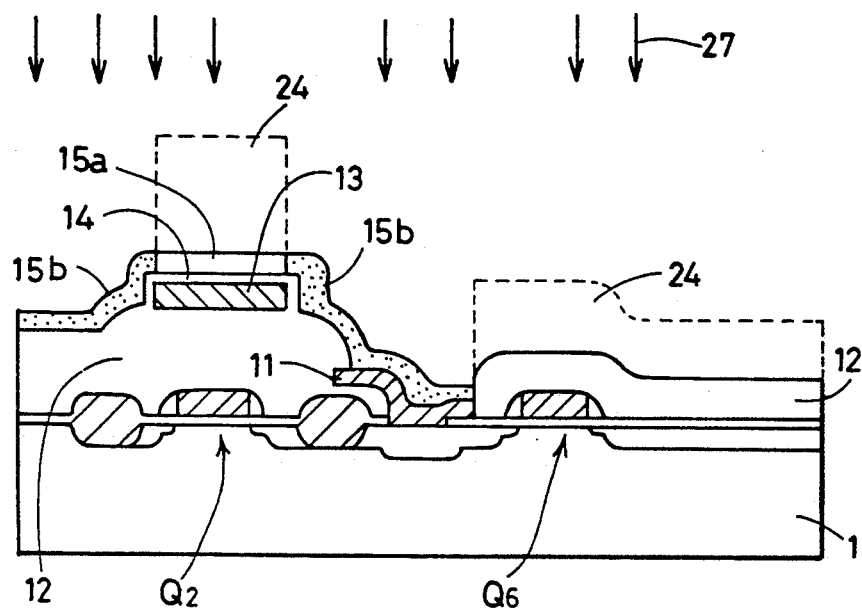

Then, referring to FIG. 12, a resist pattern 24 is formed to cover a predetermined region, and p-type impurity ions, for example, boron ions 27 are ion-implanted into silicon layer 15 using resist pattern 24 as a mask. Source/drain regions 15b, 15b are formed by the ion implantation.

Figure 13:
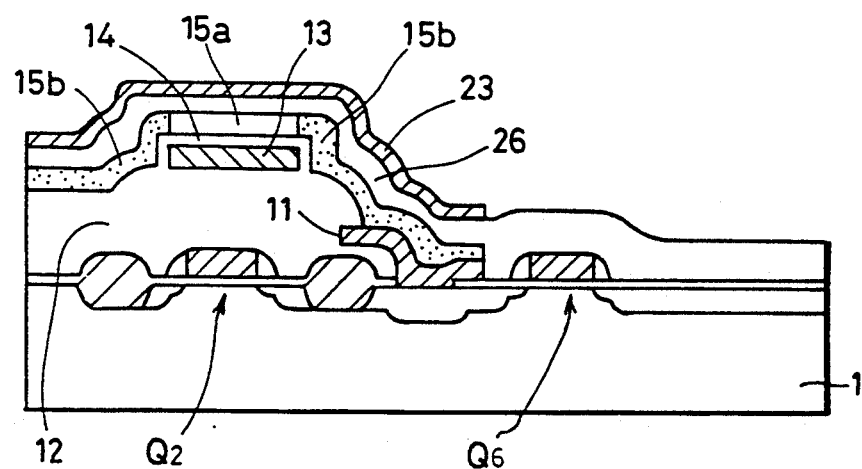

Then, referring to FIG. 13, resist pattern 24 is removed, and then, a third interlayer insulating layer, for example, a silicon oxide film is formed on the whole surface by a CVD process to have a thickness in the range of about 1000 Å to about 2000 Å. Then, an oxidation preventing film 23 is formed on the surface of third interlayer insulating layer 26. The materials as described above are used to form the oxidation preventing film. If a silicon nitride film is used, the film is formed to have a thickness of at least 50 Å. This is because there is a case where the silicon nitride film can not have an effect of preventing oxygen from passing through when the silicon nitride film has a small thickness.

Figure 14:
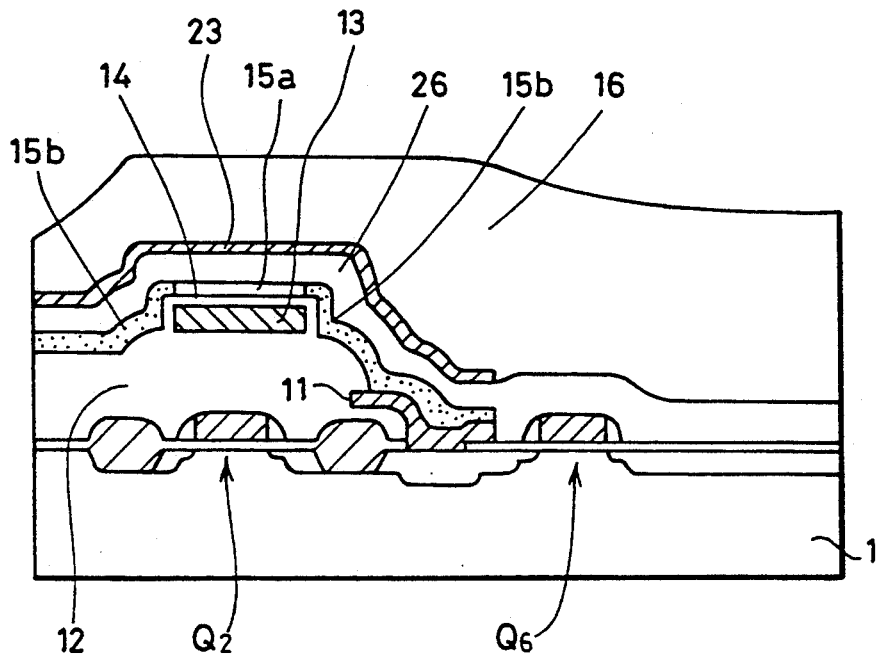

Then, referring to FIG. 14, oxidation preventing film 23 is patterned in a predetermined shape, and then, BPSG 16 is deposited on the whole surface to have a thickness of about 1 μm. Then, high temperature heat treatment is carried out in an atmosphere of wet oxidation at a temperature in the range of 850° C. to 900° C. for about 20–30 minutes. This causes the surface of the BPSG to reflow to be flattened. At this time, as described above, oxidation preventing film 23 is covering the surface of silicon layer 15, so that a phenomenon in which the surface of silicon layer 15 is oxidized to-form a silicon oxide film so as to cause the thickness of silicon layer 15 to be reduced is prevented.

Figure 15:
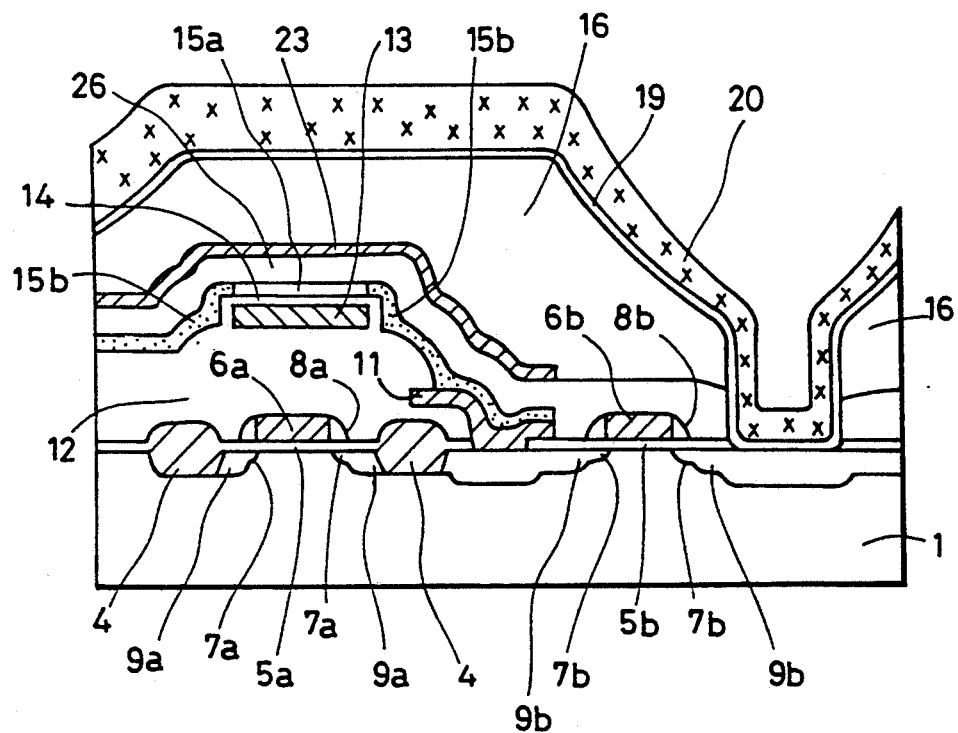

Then, referring to FIG. 15, a contact hole is formed in a predetermined region in interlayer insulating layer 16, and a barrier metal layer 19 and an aluminum interconnection layer 20 are formed. Thus, a memory cell in a SRAM is completed.

Figure 16:
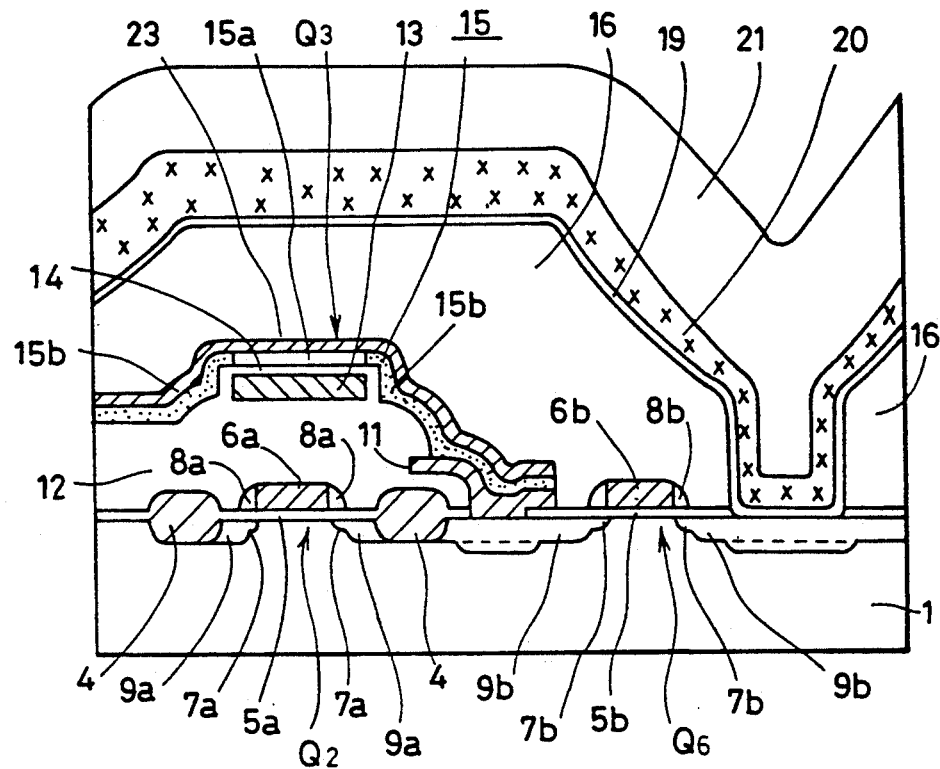
FIG. 16 is a cross sectional view illustrating a structure of a memory cell in a SRAM according to a second embodiment of a present invention.

Now, a second embodiment of the present invention will be described. The second embodiment illustrated in FIG. 16 differs from the first embodiment in that there is no interlayer insulating layer formed between a silicon layer 15 in a thin film transistor $Q_3$ and an oxidation preventing film 23. Specifically, oxidation preventing film 23 is formed to cover the surface of silicon layer 15 directly. In this case, it is necessary to form oxidation preventing film 23 using a material having an insulating property such as a silicon nitride film or to arrange an insulating layer such as a silicon nitride film at least in a region which is in contact with the surface of silicon layer 15. The shape of oxidation preventing film 23 is the same as that in the case of the first embodiment.

Figure 17:
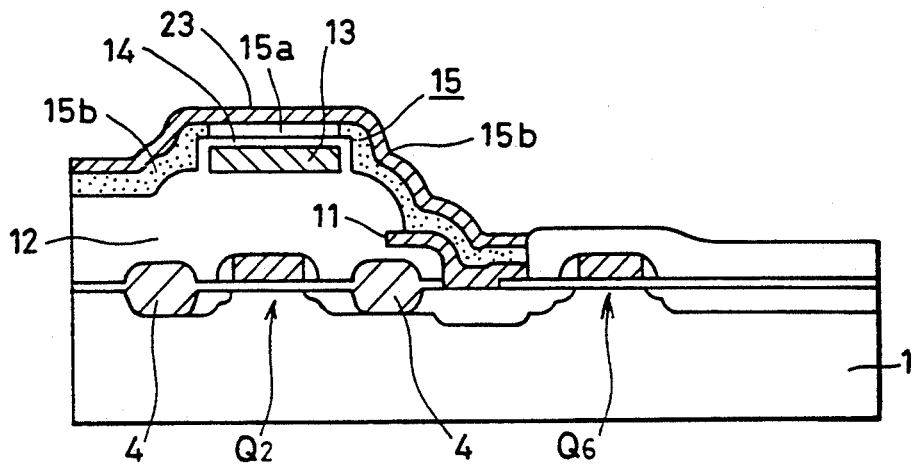
FIG. 17 is a cross sectional view illustrating the memory cell illustrated in FIG. 16 in a characteristic step of a manufacturing process.

FIG. 17 is a cross sectional view illustrating a part of a manufacturing process of a memory cell according to the second embodiment. The step illustrated in FIG. 17 is substituted for the manufacturing step illustrated in FIG. 13 according to the first embodiment. Specifically, after formation of source/drain regions 15b, 15b in silicon layer 15 in the thin film transistor, an oxidation preventing film 23 is formed on the surface of silicon layer 15.

Figure 18:
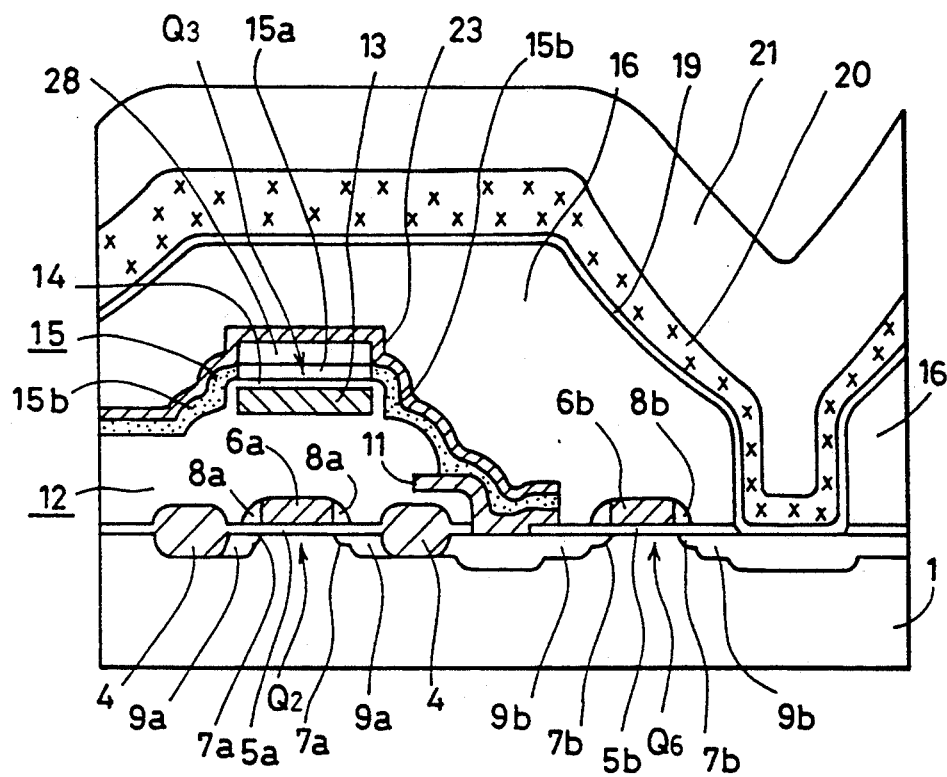
FIG. 18 is a cross sectional view illustrating a structure of a memory cell in a SRAM according to a third embodiment of the present invention.

Now, a third embodiment of the present invention will be described. In the third embodiment illustrated in FIG. 18, an oxidation preventing film 23 is formed in contact with the surfaces of impurity regions 15b, 15b in a silicon layer 15 and on the surface of a channel region 15a through an insulating layer 28. Accordingly, a material having an insulating property such as a silicon nitride film is used for forming oxidation preventing film 23 at least in parts in contact with impurity regions 15b 15b. An insulating layer 28 formed on channel region 15a in silicon layer 15 is formed of a silicon oxide film or the like, for example, and is used in a manufacturing step described in the following.

Figure 19:
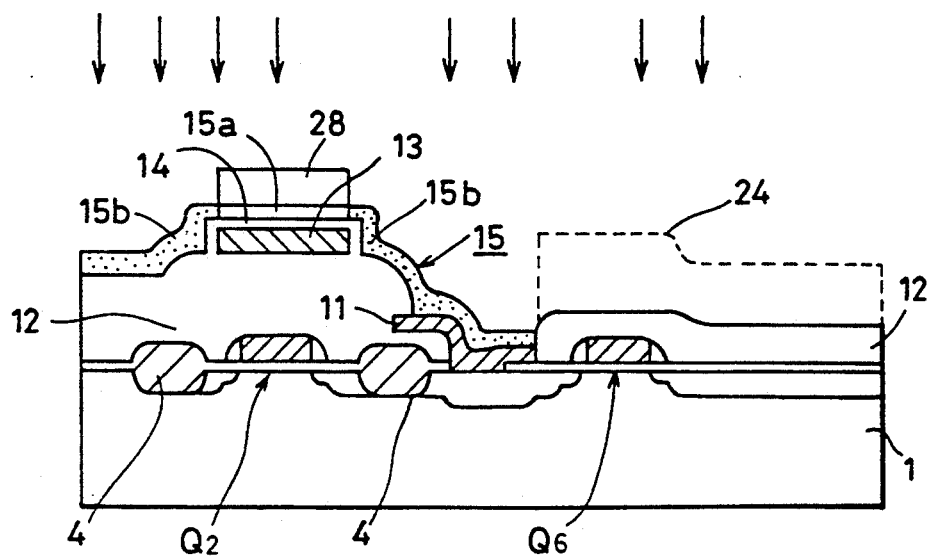
FIGS. 19 and 20 are cross sectional views of the memory cell illustrated in FIG. 18 in first and second steps of a characteristic manufacturing process.
Figure 20:
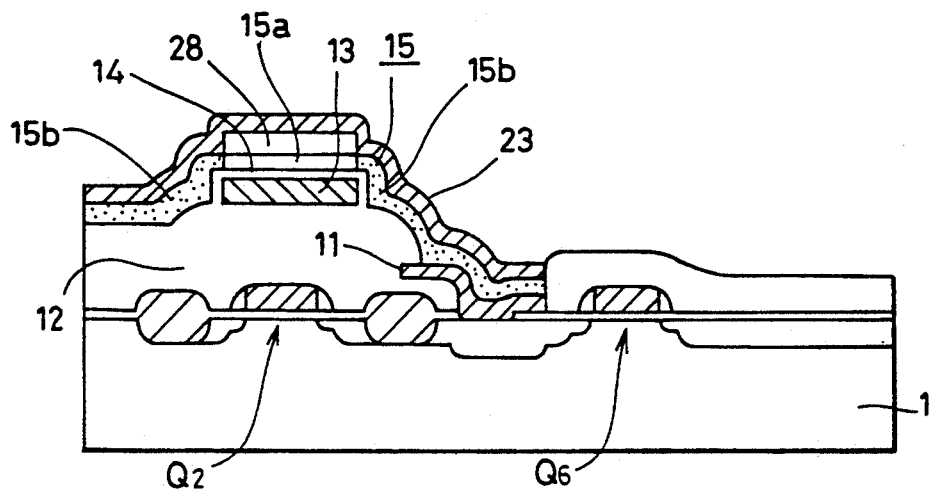

Specifically, referring to FIG. 19, insulating layer 28 is used as a mask layer when impurity ions are implanted into silicon layer 15. Then, as illustrated in FIG. 20, with insulating layer 28 being left, an oxidation preventing film 23 is formed on the surface.

Figure 21:
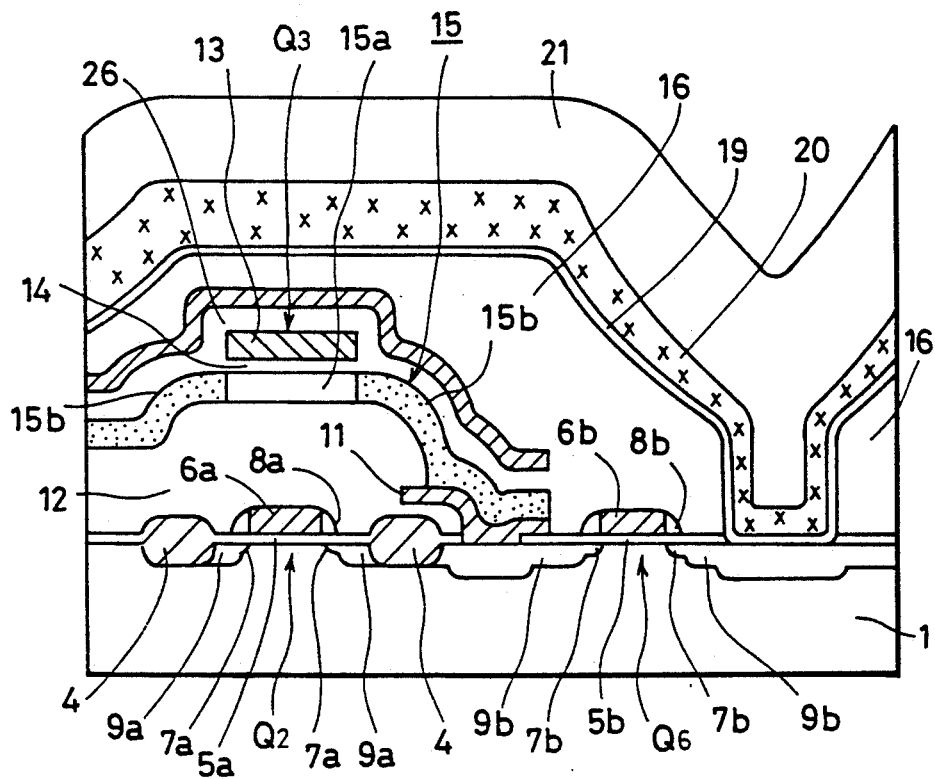
FIG. 21 is a cross sectional view illustrating a structure of a memory cell in a SRAM according to a fourth embodiment of the present invention.

A fourth embodiment of the present invention will be described. Referring to FIG. 21, the fourth embodiment differs from the first embodiment in that a thin film transistor according to the fourth embodiment has a gate electrode 13 formed above silicon layer 15. The shape and material and so forth of oxidation preventing film 23 are the same as those in the case of the first embodiment. In addition, a third insulating layer 26 is interposed between oxidation preventing film 23 and silicon layer 15 in the thin film transistor, so that it is possible to apply a material to oxidation preventing film 23 without considering conductivity or an insulating property.

Figure 22:
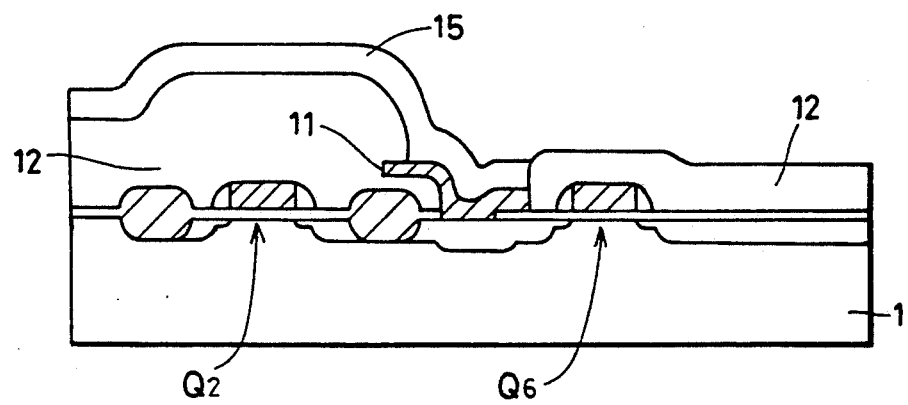
FIGS. 22-24 are cross sectional views illustrating the memory cell illustrated in FIG. 21 in first to third steps of a characteristic manufacturing process.
Figure 23:
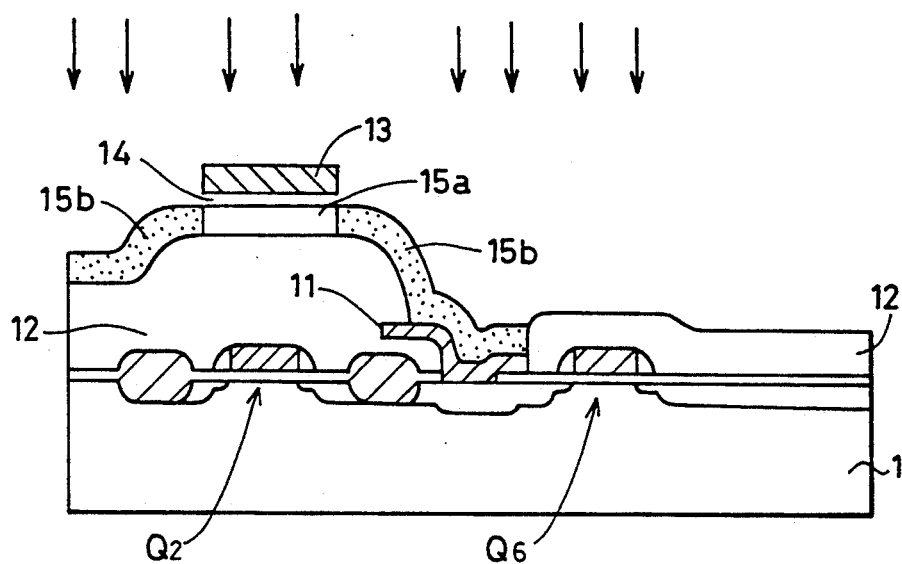
Figure 24:
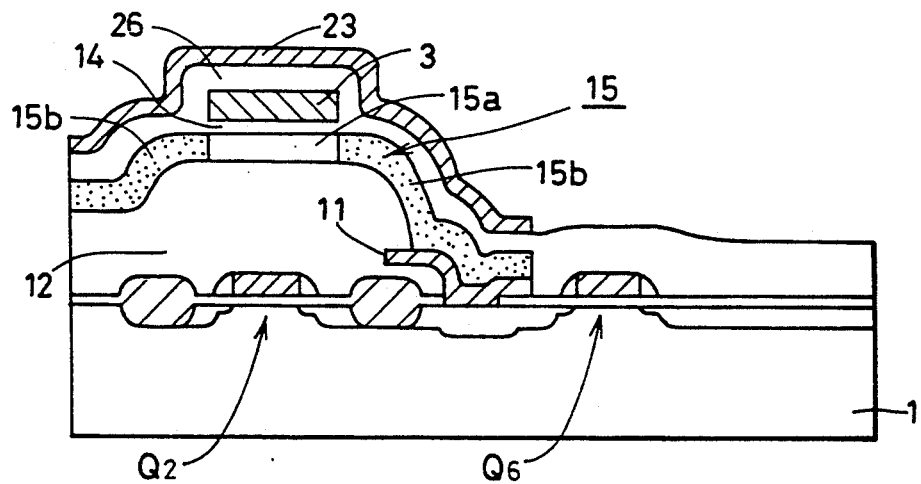

FIGS. 22 to 24 illustrates manufacturing steps which can be substituted for steps illustrated in FIGS. 9 to 13 in the manufacturing process according to the first embodiment. Specifically, referring to FIG. 22, a silicon layer 15 of polycrystalline silicon or amorphous silicon is formed on the surface of first interlayer insulating layer 12 by a CVD process. Then, silicon layer 15 is patterned into a predetermined shape by a photolithography process and an etching process.

Then, referring to FIG. 23, a thin gate insulating layer 14 is formed on the whole surface. A polycrystalline silicon layer is formed on the surface of gate insulating layer 14 and patterned to form a gate electrode 13 of a thin film transistor. Then, impurities are ion-implanted into silicon layer 15 using gate electrode 13 as a mask to form source/drain regions 15b, 15b.

Then, referring to FIG. 24, a third interlayer insulating layer 26 is deposited on the whole surface using a CVD process, for example. Then, an oxidation preventing film 23 is formed on the surface of third interlayer insulating layer 26. Then, oxidation preventing film 23 is patterned into a predetermined shape.

Figure 25:
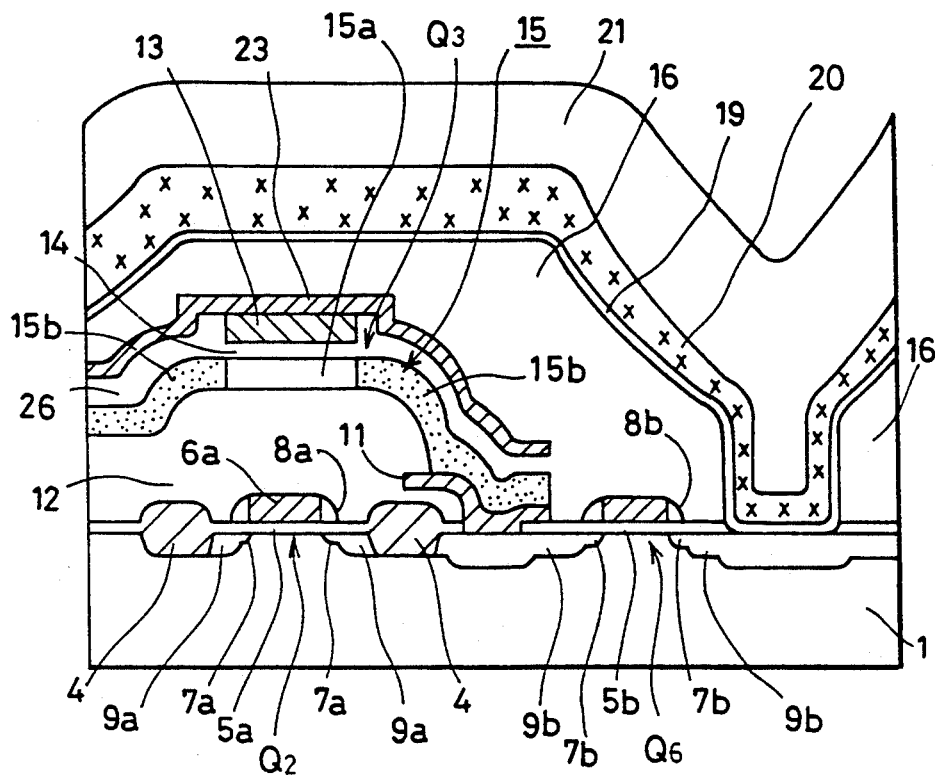
FIG. 25 is a cross sectional view illustrating a structure of a memory cell in a SRAM according to a fifth embodiment of the present invention.

Now, a fifth embodiment of the present invention will be described. The fifth embodiment differs from the fourth embodiment in that an oxidation preventing film 23 positioned above a gate electrode 13 in a thin film transistor is formed to be directly in contact with the surface of gate electrode 13 in a memory cell illustrated in FIG. 25. Specifically, it is possible to flatten the surface of oxidation preventing film 23 by removing a third interlayer insulating layer 26 on gate electrode 13. Accordingly, it is possible to form an interconnection layer formed on the surface of oxidation preventing film 23 on a flatter surface.

Figure 26:
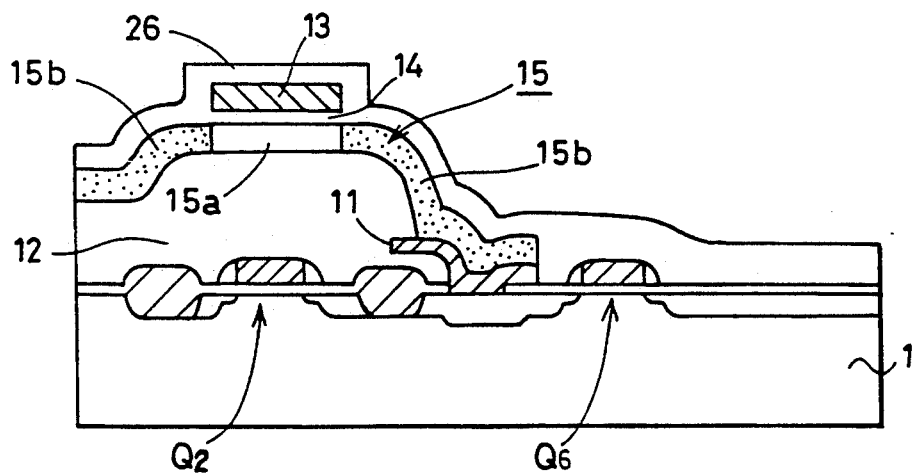
FIGS. 26–28 are cross sectional views illustrating the memory cell illustrated in FIG. 25 in first to third steps of a characteristic manufacturing process.
Figure 27:
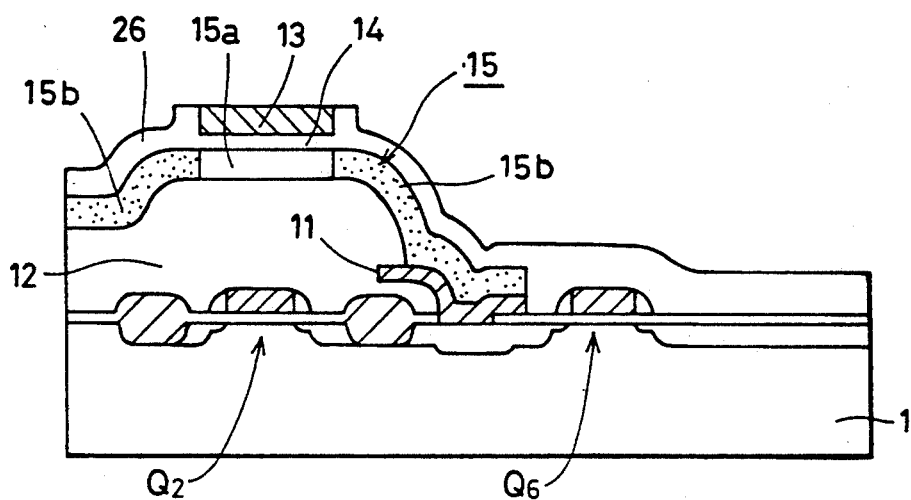
Figure 28:
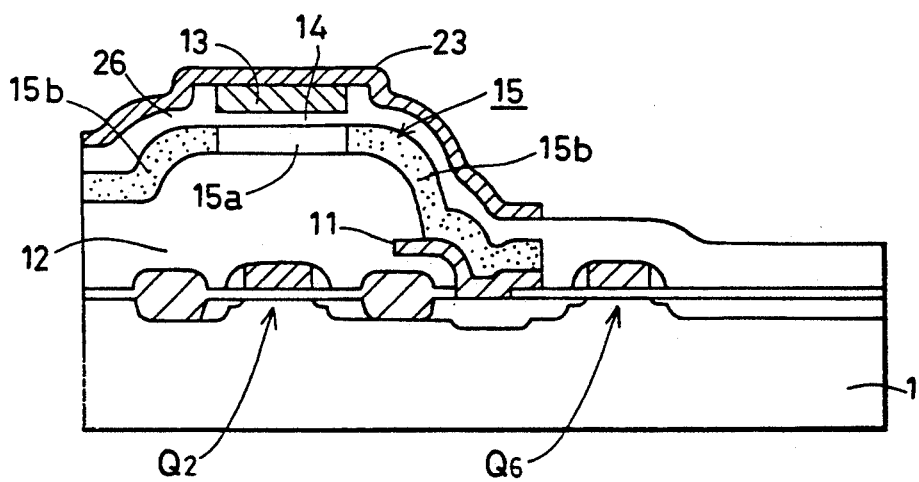

Characteristic manufacturing steps of the memory cell according to the fifth embodiment are illustrated in FIGS. 26 to 28. Specifically, after the manufacturing step illustrated in FIG. 23 according to the fourth embodiment, a third interlayer insulating layer 26 is formed on the whole surface as illustrated in FIG. 26.

Then, as illustrated in FIG. 27, only a part of third interlayer insulating layer 26 positioned on the surface of gate electrode 13 is selectively removed by a photolithography process and an etching process.

Then, referring to FIG. 28, an oxidation preventing film 23 is formed on the whole surface and patterned into a predetermined shape.

Figure 29:
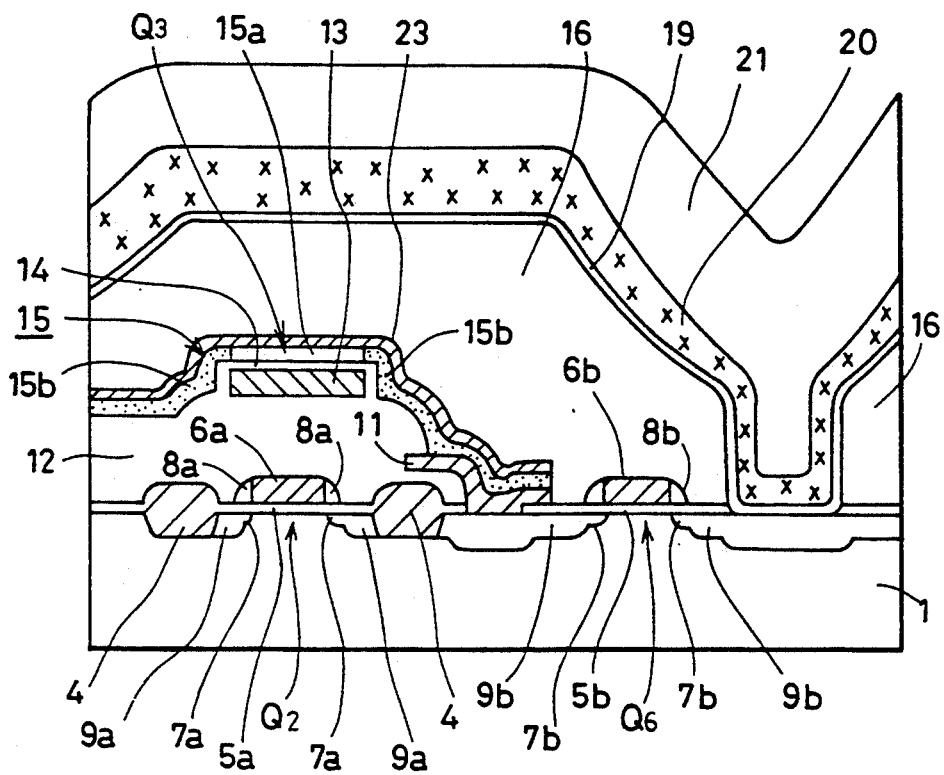
FIG. 29 is a cross sectional view illustrating a structure of a memory cell in a SRAM according to a sixth embodiment of the present invention.

Now, a sixth embodiment of the present invention will be described. A memory cell according to the sixth embodiment illustrated in FIG. 29 differs from the memory cell according to the fourth embodiment in that an oxidation preventing film 23 is formed directly in contact with the surfaces of silicon layer 15. Accordingly, it is necessary to use a material having an insulating property such as a silicon nitride film for forming oxidation preventing film 23 at least in a region in contact with channel region 13.

Figure 30:
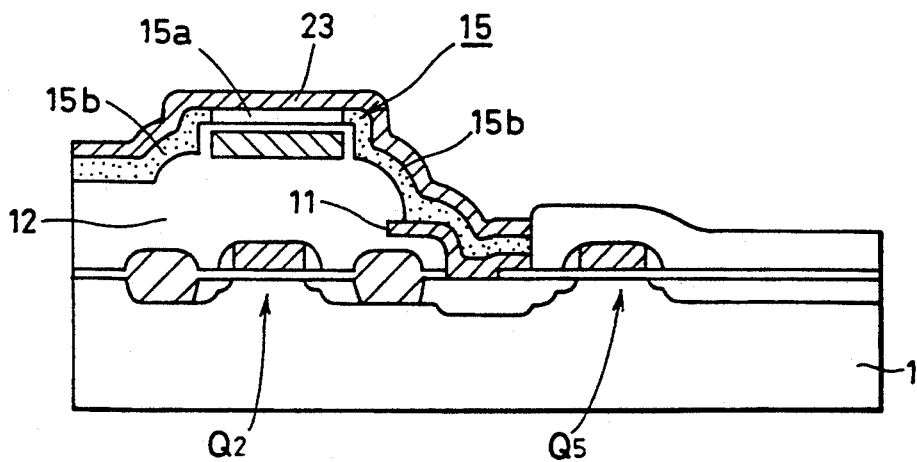
FIG. 30 is a cross sectional view of the memory cell illustrated in FIG. 29 in a characteristic manufacturing step.
Figure 31:
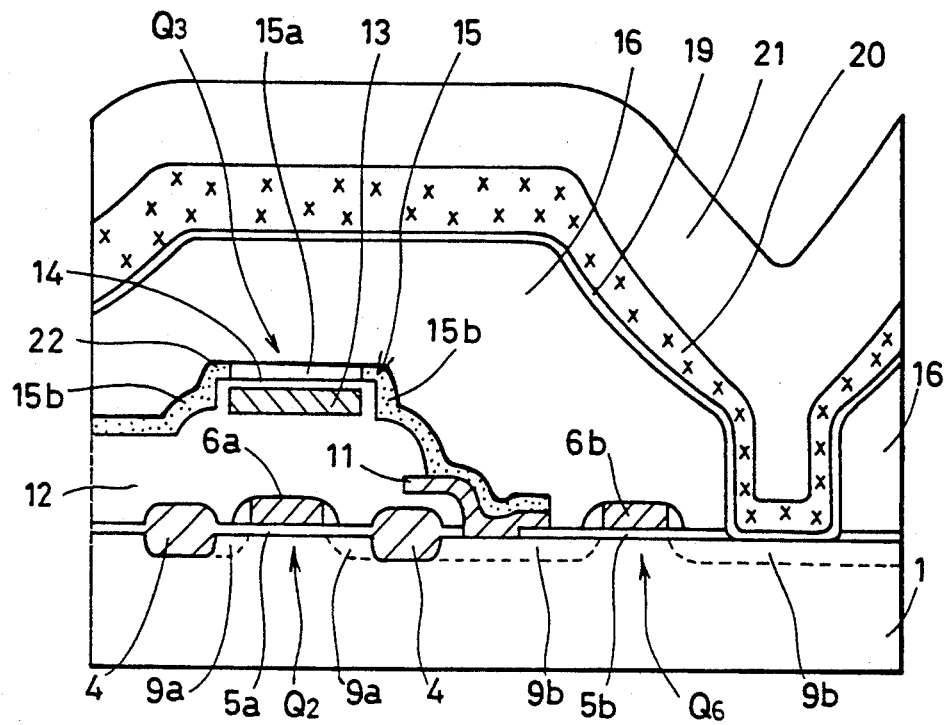
FIG. 31 is a cross sectional view illustrating a structure of a conventional memory cell in a SRAM.

A characteristic manufacturing step according to the sixth embodiment is illustrated in FIG. 30. Specifically, after the manufacturing step illustrated in FIG. 23 according to the fourth embodiment, an oxidation preventing film 23 is formed on the whole surface and patterned into a predetermined shape as illustrated in FIG. 30.

While polycrystalline silicon, amorphous silicon, refractory metal silicide, and silicon nitride have been described as material for an oxidation preventing film in the above embodiments, it is not limited to them, and other materials may be used if they have some functions for preventing oxygen from passing to the lower layer.

Furthermore, an oxidation preventing film according to the present invention is not applied only to a memory cell in a SRAM, but it can be widely applied to devices in which reduction in the thickness of a silicon layer in a thin film transistor or the like is a problem, for example. As described above, in a semiconductor device according to the present invention, an oxidation preventing film is formed on the surface of a thin film transistor, and then, an interlayer insulating layer is formed, and processing for flattening by high temperature heat treatment is carried out, so that it is possible to prevent the thickness of a silicon layer in the thin film transistor from being reduced by an oxidation reaction and to implement a semiconductor device in which the characteristics of the transistors are uniform, and the interconnection resistance is small. In addition, it becomes possible to carry out processing for flattening at a high temperature and to implement a manufacturing method of a semiconductor device in which processing for flattening the interlayer insulating layer covering the thin film transistor is easy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a thin film transistor, comprising:
    a first insulating layer formed on a semiconductor substrate;
    a thin film transistor including a gate electrode layer and a silicon layer separated from each other by a second insulating layer and formed on the surface of said first insulating layer, said thin film transistor further including a channel region formed in said silicon layer in a position opposite to said gate electrode layer, and a pair of impurity regions formed on the both sides of said channel region;
    an oxidation preventing film formed over said thin film transistor, said oxidation preventing film arranged for preventing said silicon layer in said thin film transistor from being oxidized by preventing oxygen from passing beneath said oxidation preventing film; and
    a third insulating layer formed over said oxidation preventing film.

2. The semiconductor device according to claim 1, wherein
    said silicon layer includes an interconnection part formed in the same layer as said pair of impurity regions in said thin film transistor, and
    said oxidation preventing film covers the whole surface of said silicon layer.

3. The semiconductor device according to claim 1, wherein said oxidation preventing film is formed in contact with the surface of said silicon layer.

4. The semiconductor device according to claim 1, wherein said oxidation preventing film is formed to cover said silicon layer through a third insulating layer formed on the surface of said silicon layer.

5. The semiconductor device according to claim 1, wherein said oxidation preventing film includes a film formed of at least one material selected from the group consisting of polycrystalline silicon, amorphous silicon, silicon nitride, and refractory metal silicide.

6. The semiconductor device according to claim 1, wherein said gate electrode of said thin film transistor is formed on the surface of said first insulating layer, and
    a silicon layer above said gate electrode is formed on the surface of said second insulating layer.

7. The semiconductor device according to claim 2, wherein said silicon layer is formed on the surface of said first insulating layer, and said gate electrode of said thin film transistor is formed on the surface of said silicon layer through said second insulating layer.

8. The semiconductor device according to claim 6, wherein said oxidation preventing film covers the whole surface of said silicon layer.

9. The semiconductor device according to claim 7, wherein said oxidation preventing film covers the surface of said silicon layer and the surface of said gate electrode.

* * * * *